United States Patent
Makabe et al.

(10) Patent No.: US 7,416,964 B2
(45) Date of Patent: Aug. 26, 2008

(54) SEMICONDUCTOR WAFER, SEMICONDUCTOR CHIP AND DICING METHOD OF A SEMICONDUCTOR WAFER

(75) Inventors: Ryu Makabe, Tokyo (JP); Yuichi Kunori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 242 days.

(21) Appl. No.: 11/455,652

(22) Filed: Jun. 20, 2006

(65) Prior Publication Data

US 2006/0231926 A1 Oct. 19, 2006

Related U.S. Application Data

(62) Division of application No. 10/662,276, filed on Sep. 16, 2003, now Pat. No. 7,078,805.

(30) Foreign Application Priority Data

Oct. 17, 2002 (JP) ............................ P 2002-302993

(51) Int. Cl.
*H01L 21/46* (2006.01)
*H01L 23/48* (2006.01)
(52) U.S. Cl. ...................... 438/462; 257/734
(58) Field of Classification Search ................ 257/734, 257/782; 438/460–462
See application file for complete search history.

(56) References Cited

U.S. PATENT DOCUMENTS

| 5,982,042 | A | 11/1999 | Nakamura |
| 6,365,443 | B1 | 4/2002 | Hagiwara et al. |
| 6,521,975 | B1 | 2/2003 | West et al. |
| 6,686,224 | B2 | 2/2004 | Higashi |
| 6,867,479 | B2 | 3/2005 | Hubner |
| 6,872,599 | B1 * | 3/2005 | Li et al. .................... 438/123 |
| 2002/0192928 | A1 * | 12/2002 | Kosugi ..................... 438/462 |
| 2003/0032263 | A1 | 2/2003 | Nagao et al. |

FOREIGN PATENT DOCUMENTS

| JP | 9-252034 | 9/1997 |
| JP | P2001-60567 | 3/2001 |

* cited by examiner

*Primary Examiner*—Calvin Lee
(74) *Attorney, Agent, or Firm*—McDermott Will & Emery LLP

(57) ABSTRACT

The metal wirings of the uppermost layer are exposed so as to be contactable to the probe and arranged so as to be spatially separated from one another via spaces that are approximately parallel to the longitudinal direction of the dicing area, and the position and size of the space is designed considering a thickness of a cutting edge of a blade and relative positioning error, and the blade does not cross any metal wirings when the blade passes through the dicing area, thereby preventing the generation of an abruption or a burr due to the dicing to enhance a yield in IC production.

5 Claims, 11 Drawing Sheets

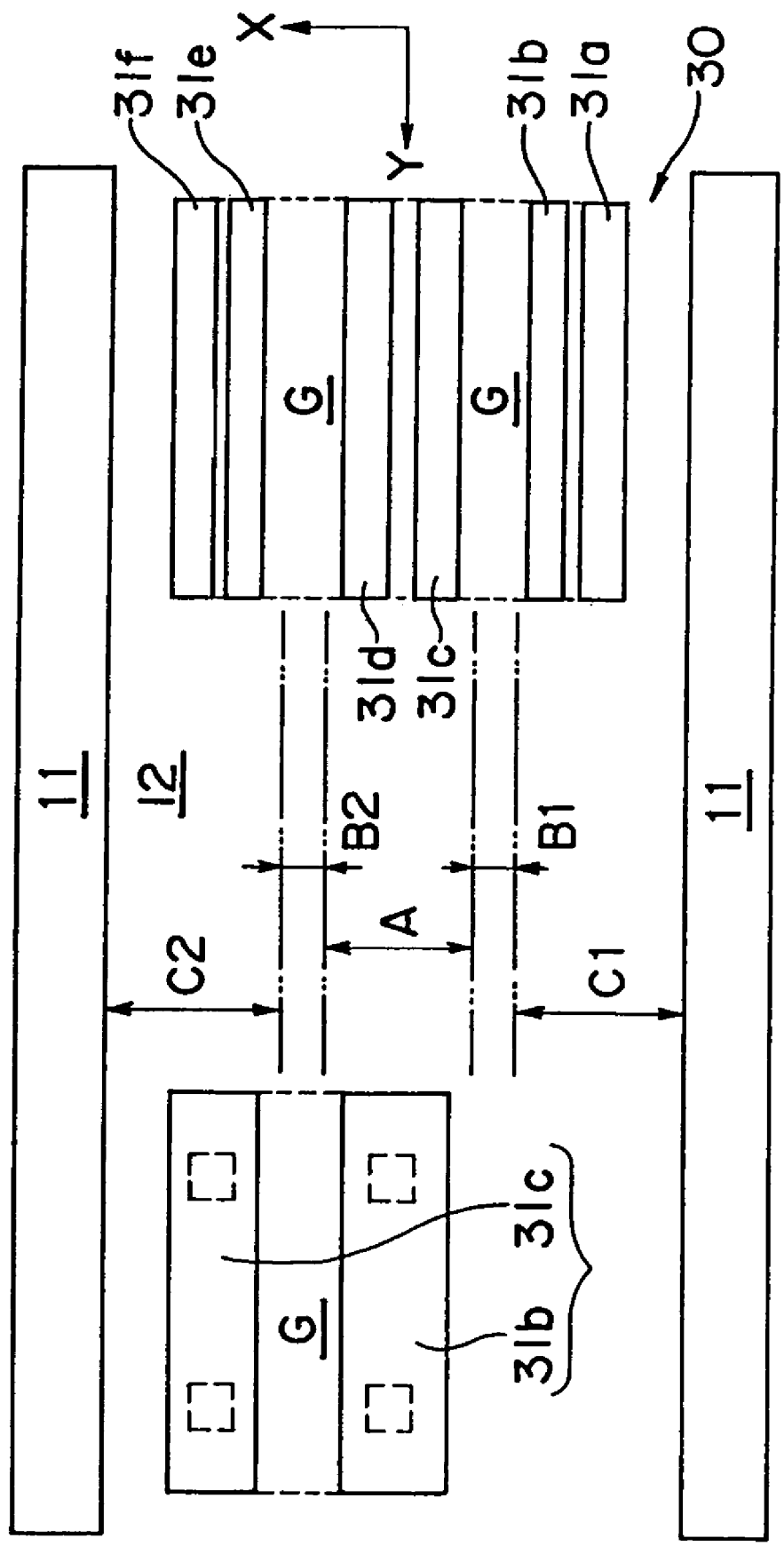

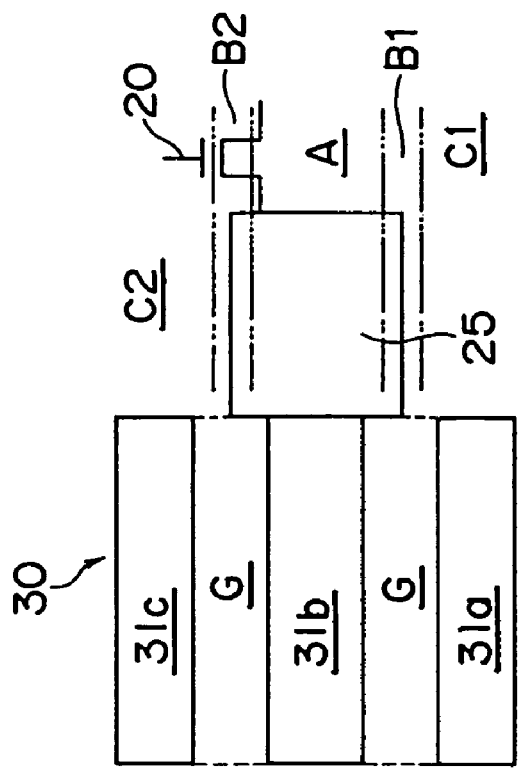
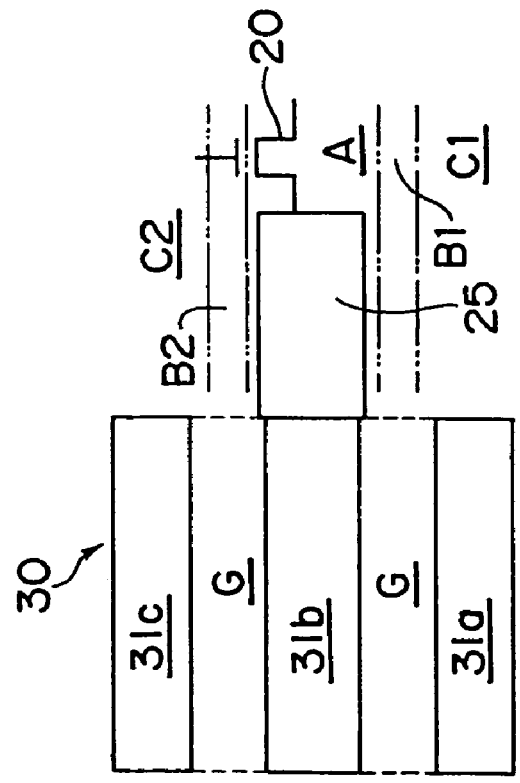

SEMICONDUCTOR WAFER, SEMICONDUCTOR CHIP AND DICING METHOD OF A SEMICONDUCTOR WAFER

RELATED APPLICATIONS

This application is a divisional of U.S. patent application Ser. No. 10/662,276, filed Sep. 16, 2003,and issued as U.S. Pat. No. 7,078,805 which is based on Japanese Patent Application No. JP 2002-302993, filed Oct. 17, 2002 the contents of which are hereby incorporated by reference.

BACKGROUND OF THE INVENTION

1. Field of the Invention

The present invention relates to a semiconductor wafer having a characteristic evaluating device and a monitoring pad formed in a dicing area and a semiconductor chip obtained by cutting this Wafer. Further, the present invention relates to a dicing method for cutting such a wafer.

2. Description of the Background Art

FIGS. 11A-11C are explanatory views showing one example of a conventional process for producing an IC(Integrated Circuit), wherein FIG. 11A shows a dicing process, FIG. 11B shows a state after dicing and FIG. 11C shows a wire bonding process. A wafer 1 is composed of a substrate 2 comprising a semiconductor of Si or GaAs and an electrical insulating layer 3 and/or metal wiring 4 formed on the substrate 2. Generally, chip areas where a large number of semiconductor devices are integrated are arranged in a matrix.

When an individual chip is taken out from the wafer 1, a blade 9 passes between each chip area for cutting each chip area as shown in FIG. 11A. When the metal wiring 4 exists on a passage line of the blade 9, a dicing stress is applied to the metal wiring 4 to cause a partial separation of the metal wiring 4 in the case of weak adhesion to a underlayer, with the result that a burr 4a is likely to occur as shown in FIG. 11B.

Consequently, when the individual chip is mounted on a lead frame 5 for connecting via a wire 6, there is a high possibility that the wire 6 comes in contact with the burr 4a, that becomes a factor of malfunction of a product.

SUMMARY OF THE INVENTION

An object of the present invention is to provide a semiconductor wafer, semiconductor chip and a dicing method of a semiconductor wafer that can prevent the generation of a burr due to the dicing, thereby enhance a yield in IC production.

A semiconductor wafer of the present invention comprising:

a plurality of chip areas in which a number of semiconductor elements are formed;

a dicing area provided at the outside of each chip area;

a characteristic evaluating element formed in the dicing area; and a probe-contactable monitoring pad formed in the dicing area and electrically connected to the characteristic evaluating element;

wherein the monitoring pad includes two or more exposed surfaces divided via a space that is approximately parallel to the longitudinal direction of the dicing area.

A semiconductor chip of the present invention comprising:

a chip area in which a number of semiconductor elements are formed;

a dicing area provided at the outside of the chip area; and a metal wiring formed in the dicing area.;

wherein the metal wiring is not exposed on a dicing cutting surface.

A method of the present invention for dicing a semiconductor wafer having:

a plurality of chip areas in which a number of semiconductor elements are formed;

a dicing area provided at the outside of each chip area;

a characteristic evaluating element formed in the dicing area; and a metal wiring formed in the dicing area and electrically connected to the characteristic evaluating element;

this method including a step of relatively moving a blade along a longitudinal direction of the dicing area for cutting a portion of the dicing area out, wherein a coordinate axis Y is defined by a dicing center line, a coordinate axis X is defined by a direction perpendicular to the dicing center line, D is defined by a thickness of a cutting edge of the blade and $\pm\sigma$ is defined by a relative positioning error between the dicing blade and the semiconductor wafer in the direction of X and, in case where the dicing area is demarcated into five areas that are an area A $(-D/2+\sigma<x<D/2-\sigma)$, an area B1 $(-D/2-\sigma<x<-D/2+\sigma)$, an area B2 $(D/2-\sigma<x<D/2+\sigma)$, an area C1 $(x<-D/2\sigma)$ and an area C2 $(D/2+\sigma<x)$, the metal wiring is exposed in any one of areas of A, C1 and C2 while the metal wiring is not exposed in the areas B1 and B2.

According to the invention, in case where a characteristic evaluating element and monitoring pad are formed in a dicing area of a wafer, the monitoring pad is divided into two or more exposed surfaces, among which a space is provided that is approximately parallel to the longitudinal direction of the dicing area, whereby a blade can be positioned so as not to cross over a metal wiring. Consequently, an abruption or a burr of the metal wiring can be prevented during dicing, thereby enhancing a yield and reliability of an IC product.

BRIEF DESCRIPTION OF THE DRAWINGS

These and other objects and features of the present invention will become clear from the following description taken in conjunction with the preferred embodiments thereof and the accompanying drawings throughout which like parts are designated by like reference numerals.

FIG. 1A is a plan view showing one example of a semiconductor wafer according to the present invention, while

FIG. 2A is an enlarged view of a monitoring pad, while

FIG. 4 is a plan view showing another arrangement example of a monitoring pad.

FIGS. 5A and 5B are plan views showing another arrangement examples of a metal wiring, wherein FIG. 5A is a preferable arrangement, while FIG. 5B is an unsuitable arrangement.

FIGS. 6A and 6B are plan views showing yet another arrangement examples of a metal wiring, wherein FIG. 6A is a preferable arrangement, while FIG. 6B is an unsuitable arrangement.

FIGS. 7A and 7B are plan views showing yet another arrangement examples of a metal wiring, wherein FIG. 7A is a preferable arrangement, while FIG. 7B is an unsuitable arrangement.

FIG. 9A is a plan view showing still another arrangement example of a metal wiring, while

FIG. 11 is an explanatory view showing one example of a conventional IC production process, wherein

DETAILED DESCRIPTION OF THE PREFERRED EMBODIMENTS

Embodiment 1

Figure 1B:
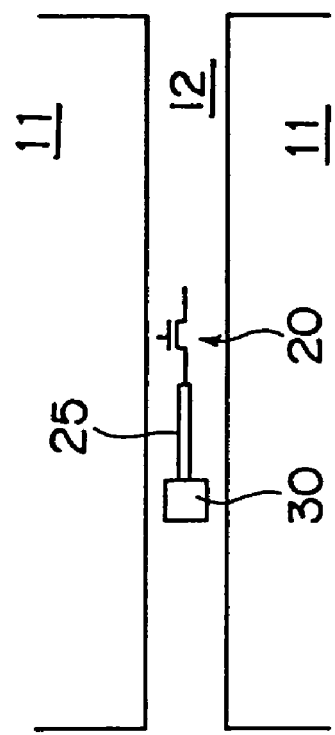
FIG. 1B is a partial enlarged view thereof.
Figure 1A:
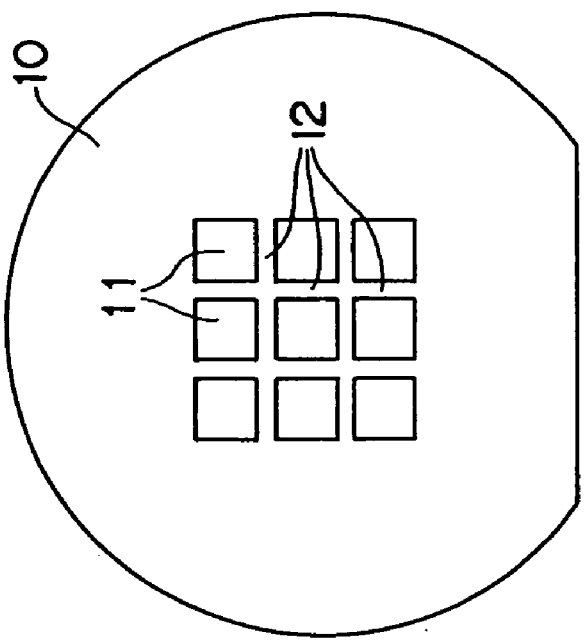

FIG. 1A is a plan view showing one example of a semiconductor wafer according to the present invention, and FIG. 1B is a partial enlarged view thereof. A wafer 10 has a substrate made of a semiconductor such as Si, GaAs or the like, on which circuit elements such as an FET (field-effect transistor), a bipolar transistor, resistor, capacitor or the like, wirings for electrically connecting these circuit elements and electrical insulating layer for insulating the wirings from one another are formed by repeatedly applying various processes such as a film-formation, mask-formation, etching, mask-removal, ion implantation or the like. Rectangular chip areas 11 where a great number of semiconductor elements are integrated are arranged in matrix in the wafer 10. Provided at the outer periphery of each chip area 11 are dicing areas 12 for cutting.

The dicing areas 12 are also referred to as "scribe areas" that are out of IC design. As shown in FIG. 1B, formed generally on each dicing area 12 is a characteristic evaluating element 20 for evaluating various manufacturing processes or characteristics of the wafer 10. The characteristic evaluating element 20 is also referred to as TEG (test element groups). Forming the characteristic evaluating element 20 by using the same process as the circuit element in the chip area 11 enables to indirectly evaluate the characteristics of the circuit element in the chip area 11.

The characteristic evaluating element 20 is made of an FET element or the like. Each terminal of the element is electrically connected to a monitoring pad 30 via a metal wiring 25. Although FIG. 1B only illustrates the metal wiring 25 and monitoring pad 30 connected to a source terminal of the FET, similar metal wiring 25 and monitoring pad 30 are provided to a gate terminal and drain terminal. Each probe of a measuring device comes in contact with each monitoring pad 30 for measuring electrical characteristics of the characteristic evaluating element 20. The metal wiring 25 and monitoring pad 30 are made of Al, Cu or alloy of these metals and arranged in the dicing area 12.

Figure 2B:
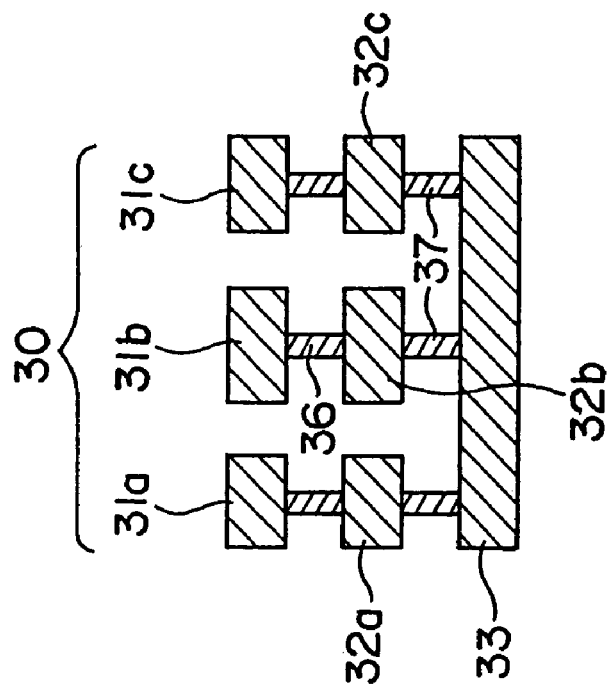
FIG. 2B is a cross-sectional view taken along a widthwise direction of a dicing area.
Figure 2A:
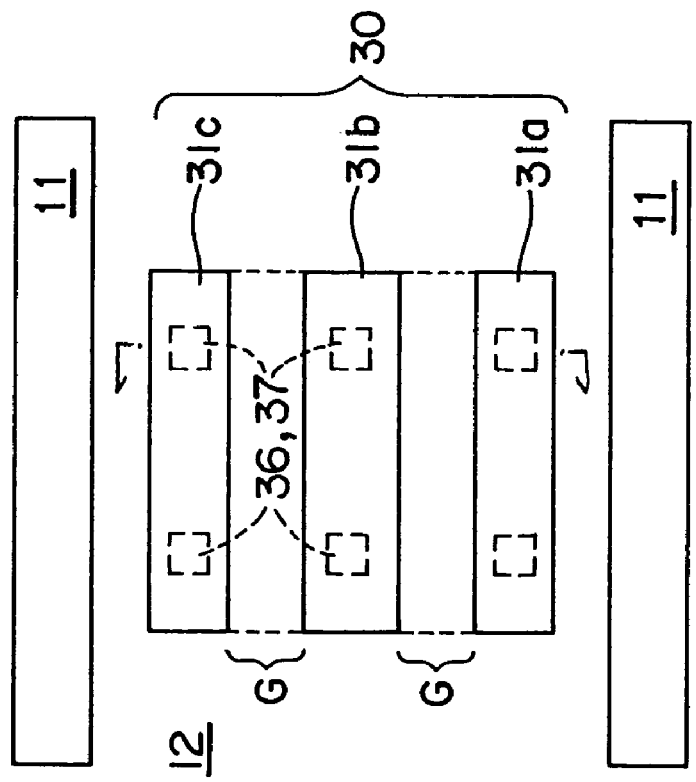

FIG. 2A shows an enlarged view of the monitoring pad 30, while FIG. 2B is a cross-sectional view taken along a widthwise direction of the dicing area 12. The monitoring pad 30 can be formed of a metal wiring of a single layer or metal wirings of plural layers. This embodiment shows an example in which the monitoring pad 30 is formed of a three-layered metal wiring.

As shown in FIG. 2B, a metal wiring 33 that is a lowermost layer, metal wirings 32a, 32b and 32c that are an intermediate layer and metal wirings 31a, 31b and 31c that are an uppermost layer are laminated via electrical insulating layers (not shown). According to need, through conductors 36 and 37 for causing an electrical connection in the vertical direction may be formed to penetrate the electrical insulating layer.

The metal wirings 31a, 31b and 31c of the uppermost layer are exposed so as to be contactable to the probe and arranged so as to be spatially separated from one another via spaces G that are approximately parallel to the longitudinal direction of the dicing area 12. The position and size of the space G is designed considering a thickness of a cutting edge of a blade and relative positioning error. Specifically, they are designed such that the blade does not cross any metal wirings 31a, 31b and 31c when the blade passes through the dicing area 12 in the dicing process.

The probe-contactable surface is divided into a plurality of exposed surfaces by providing the space G, thereby being capable of preventing an abruption or a burr of the metal wiring during the dicing process. Consequently, a yield and reliability of an IC product are enhanced.

This embodiment shows that the probe-contactable surface of the monitoring pad 30 is divided into three, but it may. be divided into two or four or more exposed surfaces so long as being in the dicing area 12 and in the place other than the space G. Further, the metal wiring 25 formed by the same manner as the monitoring pad 30 is preferably arranged in the place other than the space G from the viewpoint of preventing a burr.

In case where the monitoring pad 30 is formed of metal wirings of plural layers, at least one layer among the metal wirings of the inner layer is preferably divided with the same shape as the uppermost exposed surfaces like the metal wirings 32a, 32b and 32c in the intermediate layer. This can prevent an abruption or a burr of the metal wirings of the inner layer during the dicing process.

Figure 3:
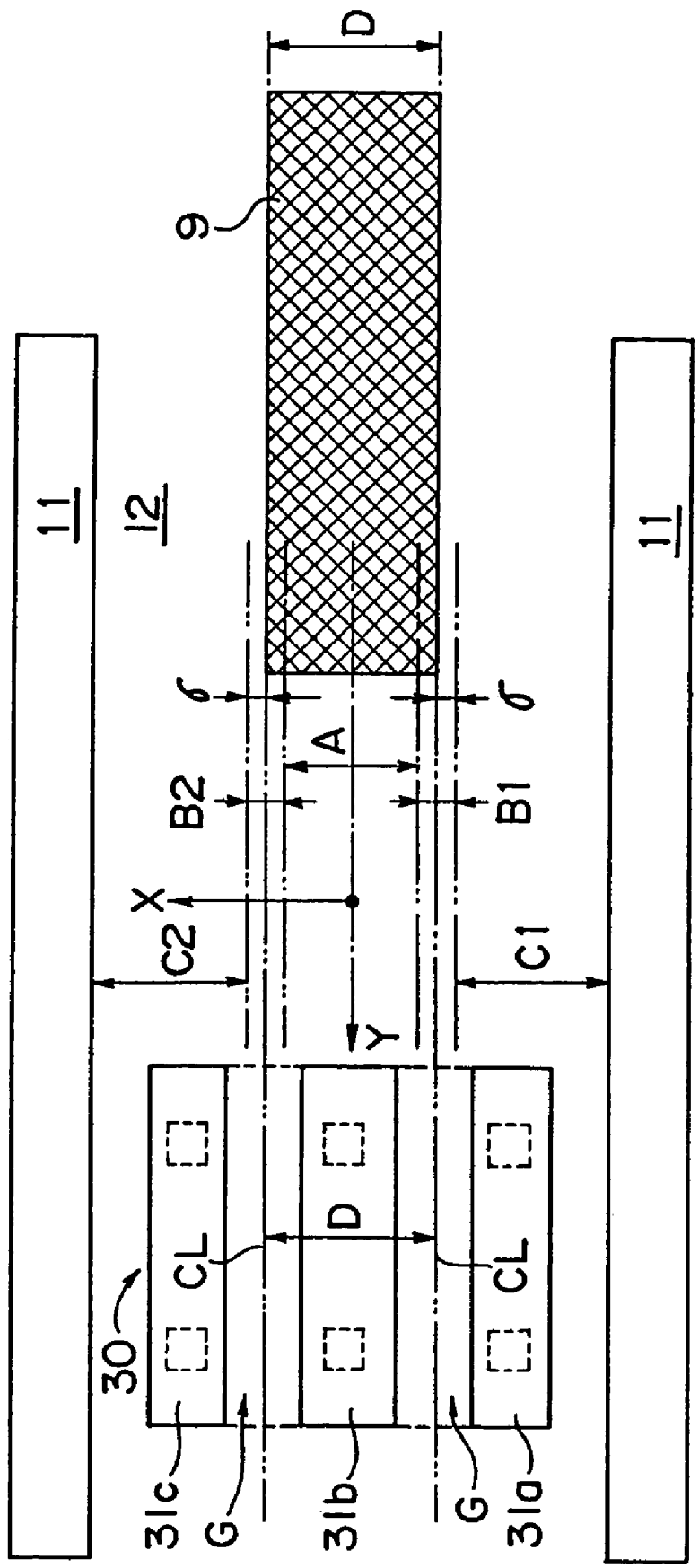
FIG. 3 is a plan view showing one embodiment of a dicing method of a semiconductor wafer according to the present invention.

FIG. 3 is a plan view showing one embodiment of a dicing method of a semiconductor wafer according to the present invention. The dicing area 12 is provided between the adjacent chip areas 11. As shown in FIG. 2, the monitoring pad 30 has three probe-contactable surfaces including metal wirings 31a, 31b and 31c, which are arranged in a place other. than the space G.

The blade 9 moves relatively parallel to the longitudinal direction of the dicing area 12. The blade 9 may linearly moves while the wafer stays, or a wafer stage loaded with the wafer 12 may linearly moves while the blade 9 stays. The blade 9 for use generally has a thickness D of the cutting edge smaller than the width of the dicing area 12, so that a portion of the dicing area 12 is actually cut away. Accordingly, two cutting lines CL are formed at the positions on both sides that are far from the dicing center line of the blade 9 by a distance D/2.

Here, a coordinate axis Y is defined by the dicing center line, a coordinate axis X is defined by a direction perpendicular to the dicing center line, D is defined by the thickness D of the cutting edge of the blade and ±σ is defined by a relative positioning error between the dicing blade and the semiconductor wafer in the direction of X, wherein the error ±σ is a total of the positioning error of the blade 9 and the positioning error of the wafer 10, which can be determined by a precision of a blade moving mechanism and a wafer stage moving mechanism.

Then, the dicing area 12 can be demarcated into five areas A, B1, B2, C1 and C2 as follows:

Area A $(-D/2+\sigma < x < D/2-\sigma)$
Area B1 $(-D/2-\sigma < x < -D/2+\sigma)$
Area B2 $(D/2-\sigma < x < D/2+\sigma)$
Area C1 $(x < -D/2-\sigma)$
Area C2 $(D/2+\sigma < x)$ As shown in FIG. 3, the area A includes the dicing center line and is defined by lines inward from both cutting lines CL by a distance σ. This area A is always cut away by the dicing, so that the cutting lines CL do not pass this area A even if the position of the blade 9 or the wafer 10 is deviated from −σ to +σ.

The area B1 is defined by a range from −σ to +σ centering about the lower cutting line CL. The area B2 is defined by a range from −σ to +σ centering about the upper cutting line CL. The cutting lines CL pass these areas B1 and B2 when the position of the blade 9 or the wafer 10 is deviated from −σ to +σ.

The area C1 is defined by a line outward from the lower cutting line CL by a distance σ. The area C2 is defined by a line outward from the upper cutting line CL by a distance σ. The cutting lines CL do not pass these areas C1 and C2 even if the position of the blade 9 or the wafer 10 is deviated from −σ to +σ.

Accordingly, the probe-contactable surface is divided into plural exposed surfaces such that the metal wirings 31a, 31b and 31c are exposed in any one of the areas A, C1 and C2, while these wirings are not exposed in the areas B1 and B2, resulting in preventing an abruption or a burr of the metal wiring during the dicing process. Consequently, an yield and reliability of the IC product are enhanced.

Further, the spaces G existing respectively among the metal wirings 31a, 31b and 31c are preferably set to have widths same as or greater than the area B1 or B2.

Thus a rectangular semiconductor chip can be obtained when the semiconductor wafer including metal wirings 31a, 31b and 31c, each position and shape of which are devised, is cut by the blade 9 along the vertical and lateral directions. This semiconductor chip has a portion of the dicing areas 12 and a portion of the metal wirings remained at the outside of the chip area 11, so that the metal wirings are not exposed on the dicing cut surface. As a result, an abruption or a burr of the metal wiring due to the dicing can be prevented, thereby enhancing the yield and reliability of the IC product.

Embodiment 2

FIG. 4 is a plan view showing another arrangement example of the monitoring pad. The monitoring pad 30 can be formed of a metal wiring of a single layer or metal wirings of plural layers. The monitoring pad 30 at the left side has two probe-contactable surfaces comprising metal wirings 31b and 31c, which are arranged in any areas of A, C1 and C2. Specifically, the metal wirings are not arranged in the areas B1 and B2.

The monitoring pad 30 at the right side has six probe-contactable surfaces comprising metal wirings 31a to 31f. The metal wirings 31a and 31b are arranged in the area C1, the metal wirings 31c and 31d are arranged in the area A and the metal wirings 31e and 31f are arranged in the area C2. The metal wiring is not arranged in the areas B1 and B2.

These monitoring pads 30 can prevent an abruption or a burr of the metal wiring during the dicing process as mentioned above.

Embodiment 3

Figure 5A:
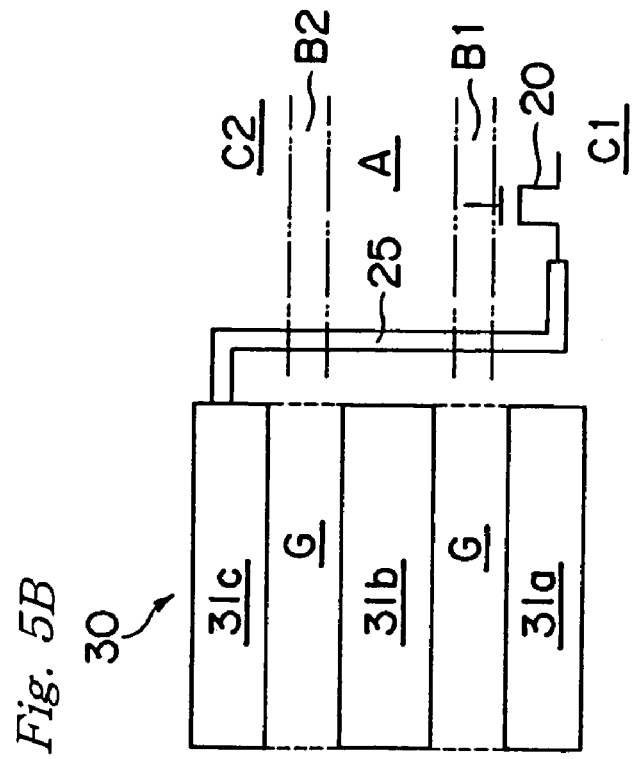
Figure 5B:
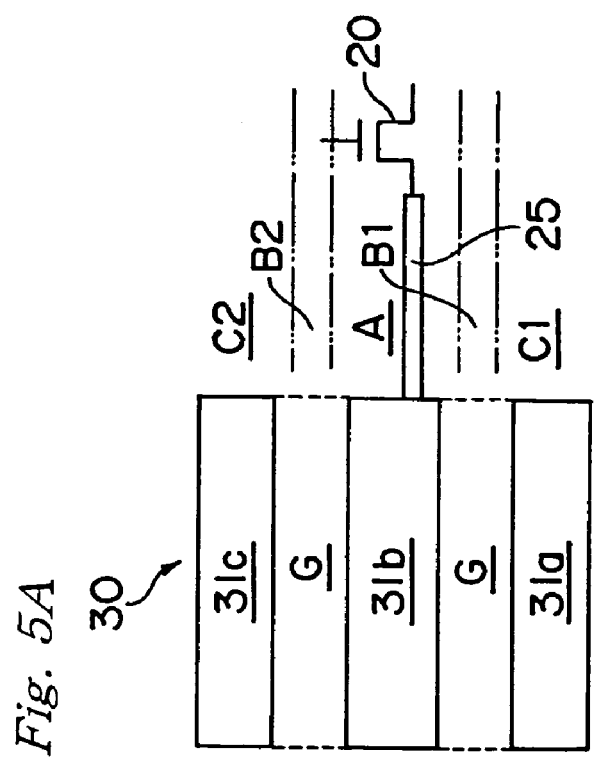

FIGS. 5A and 5B are plan views showing another arrangement examples of the metal wirings. FIG. 5A shows a preferable arrangement, while FIG. 5B shows an unsuitable arrangement. The monitoring pad 30 and metal wiring 25 can be formed of a metal wiring of a single layer or metal wirings of plural layers, and are electrically connected to the characteristic evaluating element 20 such as FET or the like.

The metal wirings 31a, 31b and 31c are exposed so as to be contactable to the probe, and arranged in the areas A, C1 and C2. The metal wiring 25 can similarly be arranged in any areas A, C1 and C2, e.g. arranged in the area A in FIG. 5A. The metal wiring is not arranged in the areas B1 and B2 where the dicing cutting surfaces can be passed, thereby being capable of preventing an abruption or a burr of the metal wiring due to the dicing.

On the other hand, the metal wiring 25 is arranged so as to cross the areas B1 and B2 in FIG. 5B. As a result, the dicing cutting surface crosses over the metal wiring 25, thereby having-possibilities of causing an abruption or a burr of the metal wiring.

Embodiment 4

Figure 6A:
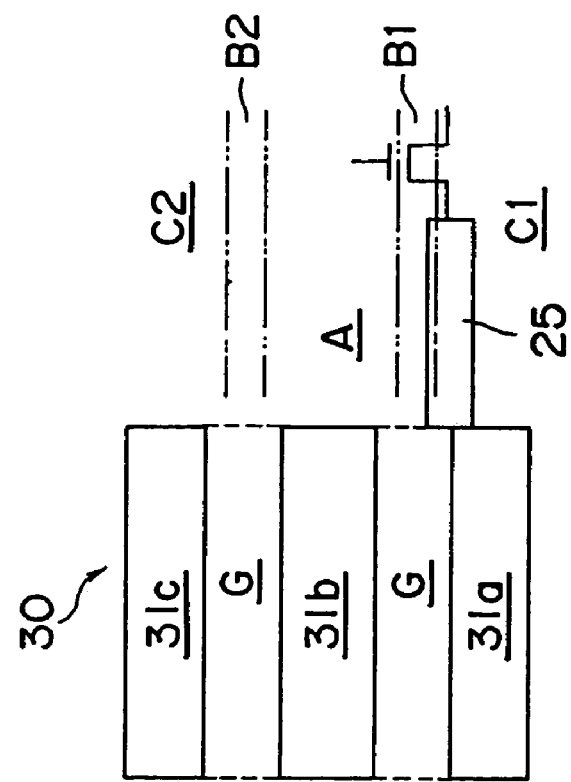
Figure 6B:
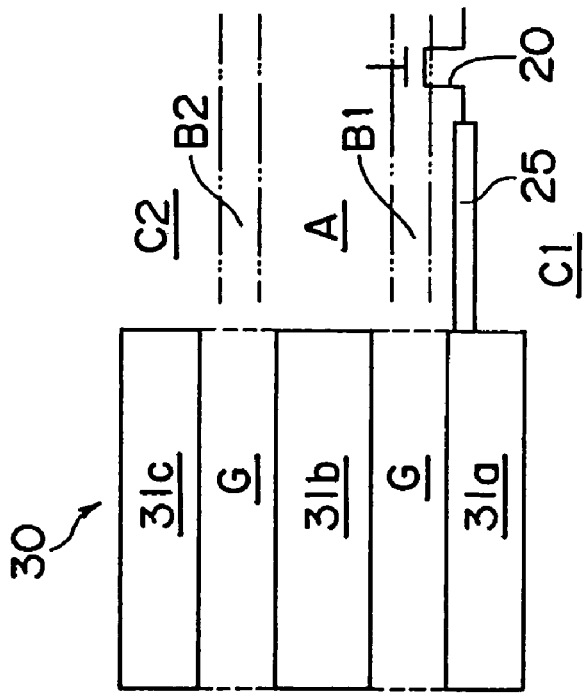

FIGS. 6A and 6B are plan views showing another arrangement examples of the metal wirings. FIG. 6A shows a preferable arrangement, while FIG. 6B shows an unsuitable arrangement. The monitoring pad 30 and metal wiring 25 are electrically connected to the characteristic evaluating element 20 such as FET or the like.

the metal wirings 31a, 31b and 31c are arranged in the areas A, C1 and C2. In FIG. 6A, the metal wiring 25 is arranged in the area C1 and not arranged in the areas B1 and B2 where the dicing cutting surfaces can be passed, thereby being capable of preventing an abruption or a burr of the metal wiring due to the dicing.

On the other hand, the metal wiring 25 is arranged in the areas B1 and C1 in FIG. 6B. As a result, the dicing cutting surface crosses over the metal wiring 25, thereby having possibilities of causing an abruption or a burr of the metal wiring.

Embodiment 5

FIG. 7A and 7B are plan views showing another arrangement examples of the metal wirings. FIG. 7A shows a preferable arrangement, while FIG. 7B shows an unsuitable arrangement. The monitoring pad 30 and metal wiring 25 are electrically connected to the characteristic evaluating element 20 such as FET or the like.

The metal wirings 31a, 31b and 31c are arranged in the areas A, C1 and C2. In FIG. 7A, the metal wiring 25 is arranged in the area A and not arranged in the areas B1 and B2 where the dicing cutting surfaces can be passed, thereby being capable of preventing an abruption or a burr of the metal wiring due to the dicing.

On the other hand, the metal wiring 25 is arranged in the areas A, B1 and B2 in FIG. 7B. As a result, the dicing cutting surface crosses over the metal wiring 25, thereby having possibilities of causing an abruption or a burr of the metal wiring.

Embodiment 6

Figure 8A:
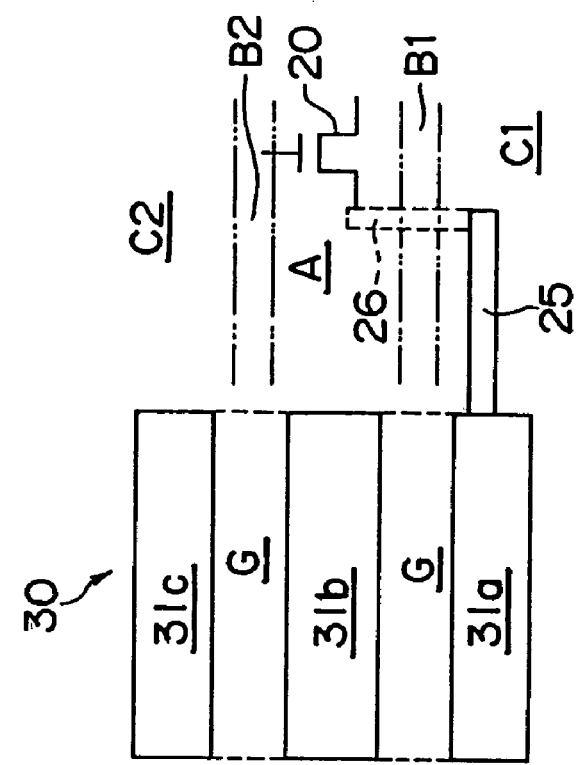
FIGS. 8A and 8B are plan views showing still another arrangement examples of a metal wiring.
Figure 8B:
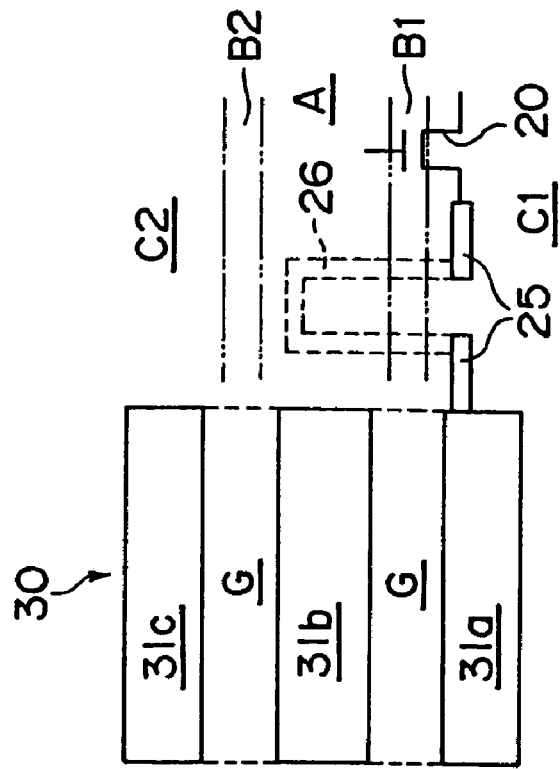

FIGS. 8A and 8B are plan views showing another arrangement examples of the metal wirings. The monitoring pad 30 and metal wirings 25 and 26 can be formed of a metal wiring of a single layer or metal wirings of plural layers, and are electrically connected to the characteristic evaluating element 20 such as FET or the like.

The metal wirings 31a, 31b and 31c are arranged in the areas A, C1 and C2. Two metal wirings 25 are arranged in the area C1. The metal wiring 26 that is an inner layer for electrically connecting these metal wirings 25 passes through the areas C1, B1, A, B1 and C1 in this order in FIG. 8A, while the metal wiring 26 passes through the areas C1, B1 and A in this order in FIG. 8B.

According to the above-mentioned structure, the metal wiring 26 is always cut off by dicing, causing that the monitoring pad 30 is electrically floated from the characteristic evaluating element 20. Therefore, a short-circuit can be prevented even if a bonding wire comes in contact with the monitoring pad 30.

Embodiment 7

Figure 9B:
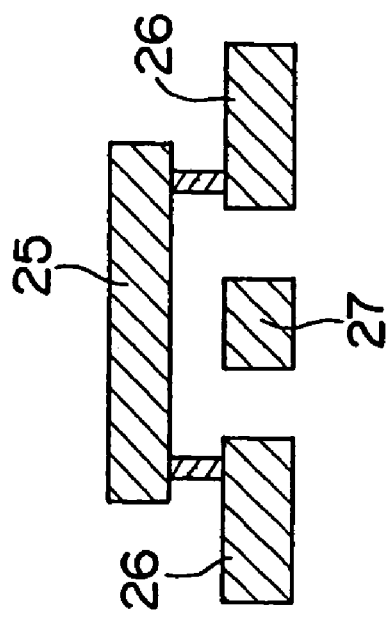
FIGS. 9B and 9C are cross-sectional views thereof.
Figure 9C:
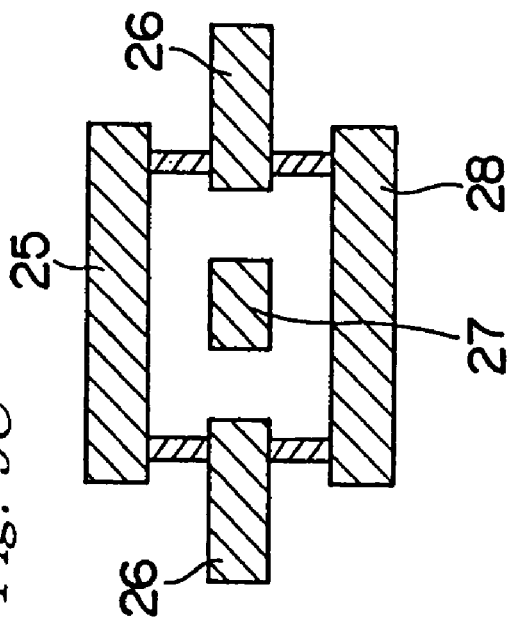
Figure 9A:
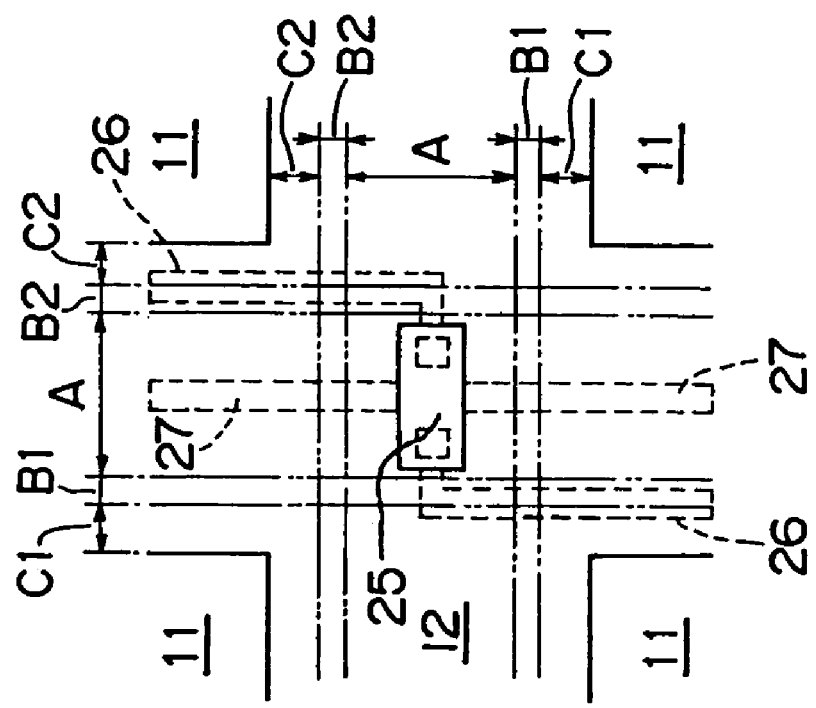

FIG. 9A is a plan view showing another arrangement example of the metal wirings, while FIGS. 9B and 9C are cross-sectional views thereof. At the cross-point in the dicing area 12, the areas A, B1, B2, C1 and C2 relating to the dicing area in the X-direction cross over the areas A, B1, B2, C1 and C2 relating to the dicing area in the Y-direction. In particular, the overlapped area of the areas A is always cut away by dicing.

At the cross-point in FIG. 9B, the metal wiring 25 for bridging is arranged at the uppermost layer, which is electrically connected to the metal wiring 26 that is the inner layer via a through conductor for going around a metal wiring 27 that is another inner layer.

At the cross-point in FIG. 9C, a wiring 28 for bridging is arranged at the lowermost layer as well as the metal wiring 25 for bridging arranged at the uppermost layer. They are electrically connected via the metal wiring 26 that is the inner layer and the through conductor for going around the metal wiring 27 that is another inner layer. In case the wiring 28 is formed of non-metal wiring, for example, is formed of a high-resistance material such as polysilicon or the like, an electrical resistance at the bridge portion can be reduced by connecting the uppermost metal wiring 25 in parallel.

This structure assures to cut the metal wiring 25 at the uppermost layer away by dicing, thereby being capable of certainly cutting off the electrical connection between the metal wirings 26.

Embodiment 8

Figure 10:
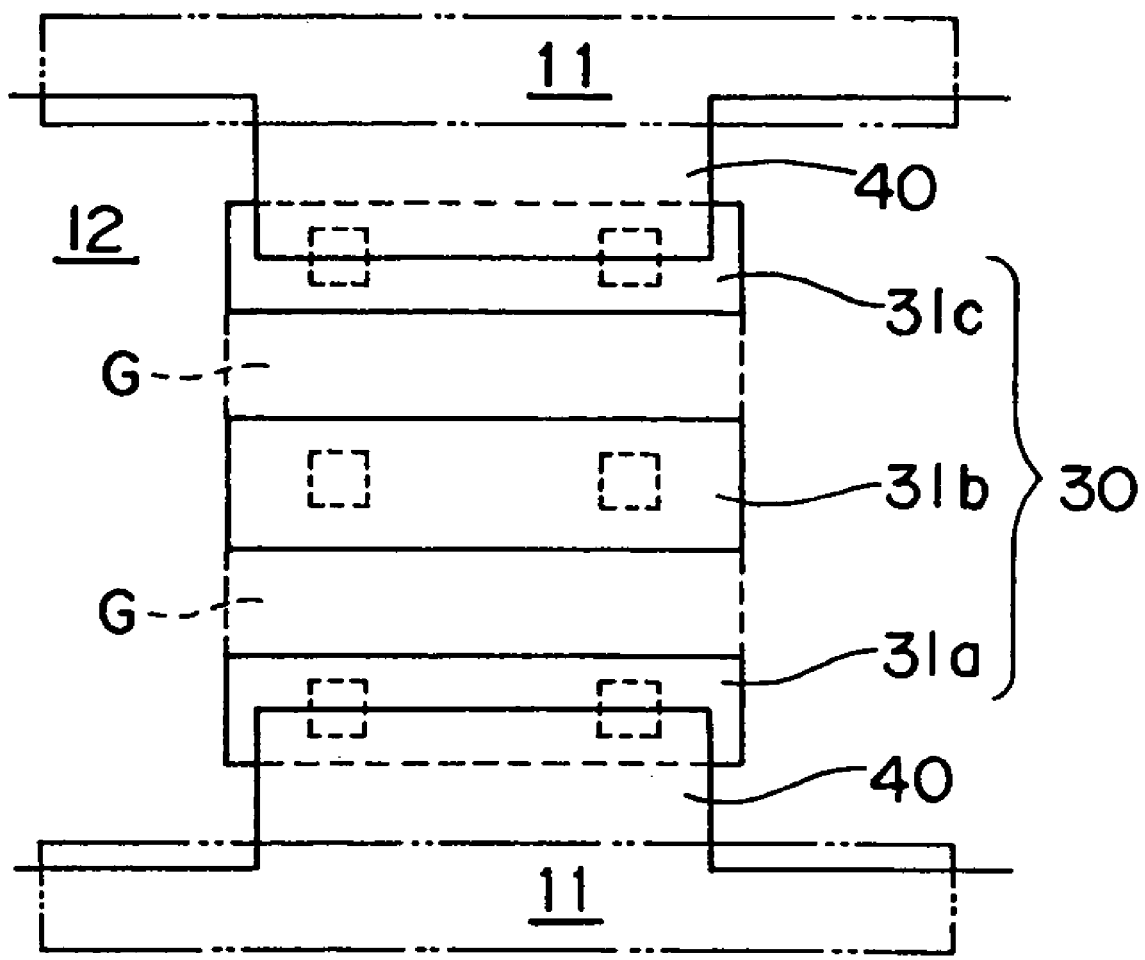
FIG. 10 is a plan view showing another arrangement example of a monitoring pad.
Figure 11A:
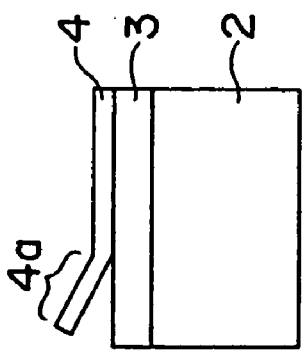
FIG. 11A shows a dicing process.
Figure 11B:
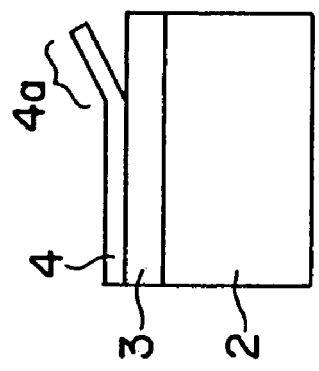
FIG. 11B shows a state after the dicing and FIG. 11C shows a wire bonding process.
Figure 11C:
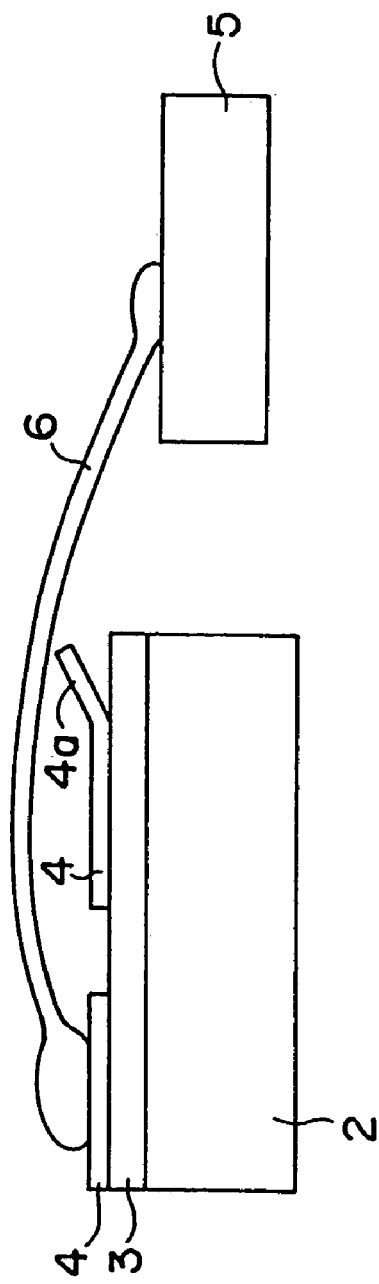

FIG. 10 is a plan view showing another arrangement example of the monitoring pad. The monitoring pad 30 can be formed of a metal wiring of a single layer or metal wirings of plural layers and has three probe-contactable surfaces comprising metal wirings 31a, 31b and 31c, which are arranged in any one of the areas A, C1 and C2 and not arranged in the areas B1 and B2.

Further, a passivation film 40 made of an electrical insulating material is generally formed on the chip area 11 in order to protect the IC chip. The passivation film 40 partially covers the metal wirings 31a and 31c exposed in the areas C1 and C2.

This passivation film 40 reduces a possibility that the bonding wire comes in contact with the metal wirings 31a and 31c, thereby being capable of preventing a defective in short-circuit. On the other hand, the metal wirings 31a and 31c preferably have a wider exposed area since they function as a probe-contactable surface. Accordingly, the edge position of the passivation film 40 is determined by considering both of the wire short-circuit and exposed area. Further, the edge of the monitoring pad 30 crossing over the blade is preferably not covered with the passivation film 40 since a stress due to dicing is concentrated on the edge.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for dicing a semiconductor wafer having:
   a plurality of chip areas in which a number of semiconductor elements are formed;
   a dicing area provided at the outside of each chip area;
   a characteristic evaluating element formed in the dicing area; and
   a metal wiring formed in the dicing area and electrically connected to the characteristic evaluating element;
   this method including a step of relatively moving a blade along a longitudinal direction of the dicing area for cutting a portion of the dicing area out,
   wherein a coordinate axis Y is defined by a dicing center line, a coordinate axis X is defined by a direction perpendicular to the dicing center line, D is defined by a thickness of a cutting edge of the blade and $\pm\sigma$ is defined by a relative positioning error between the dicing blade and the semiconductor wafer in the direction of X and, in case where the dicing area is demarcated into five areas that are an area A ($-D/2+\sigma<x<D/2-\sigma$), an area B1 ($-D/2-\sigma<x<-D/2+\sigma$), an area B2 ($D/2-\sigma<x<D/2+\sigma$), an area C1 ($x<-D/2-\sigma$) and an area C2 ($D/2+\sigma<x$) the metal wiring is exposed in any one of areas of A, C1 and C2 while the metal wiring is not exposed in the areas B1 and B2.

2. The method according to claim 1, wherein the metal wirings of plural layers is formed in the dicing area and the metal wiring of the uppermost layer is arranged in any one of areas A, C1 and C2 and the metal wiring of the inner layer is arranged so as to cross any one of the areas B1 and B2.

3. The method according to claim 1, wherein the metal wirings of plural layers is formed in the dicing area and the metal wiring for bridging is exposed at the cross-point in the overlapped area of both the area A relating to the dicing area in the X-direction and the area A relating to the dicing area in the Y-direction.

4. The method according to claim 1, wherein a passivation film is formed on the metal wiring exposed in the area C1 or C2.

5. The method according to claim 1, wherein the metal wiring includes plural layers, and one inner layer of the plural layers is arranged in any one of the areas of A, C1 and C2 while the one inner layer is not arranged in the areas B1 and B2.

* * * * *